(12) United States Patent
Liao et al.

(10) Patent No.: US 12,289,890 B2
(45) Date of Patent: Apr. 29, 2025

(54) METHOD OF FABRICATING TRANSISTOR STRUCTURE

(71) Applicant: Taiwan Semiconductor Manufacturing Company, Ltd., Hsinchu (TW)

(72) Inventors: Song-Fu Liao, Taipei (TW); Kuo-Chang Chiang, Hsinchu (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 183 days.

(21) Appl. No.: 17/885,575

(22) Filed: Aug. 11, 2022

(65) Prior Publication Data

US 2024/0064993 A1   Feb. 22, 2024

(51) Int. Cl.
*H01L 23/52* (2006.01)
*H01L 23/528* (2006.01)
*H10B 51/20* (2023.01)
*H10D 30/01* (2025.01)
*H10D 30/69* (2025.01)
*H10D 64/68* (2025.01)

(52) U.S. Cl.
CPC ......... *H10B 51/20* (2023.02); *H01L 23/5283* (2013.01); *H10D 30/0415* (2025.01); *H10D 30/701* (2025.01); *H10D 64/689* (2025.01)

(58) Field of Classification Search
CPC ... H10B 51/20; H01L 23/5283; H01L 29/516; H01L 29/6684; H01L 29/78391
USPC .............................................................. 438/3
See application file for complete search history.

(56) References Cited

U.S. PATENT DOCUMENTS

| | | | |
|---|---|---|---|
| 10,050,051 B1* | 8/2018 | Liao | H10B 43/35 |
| 11,610,621 B1* | 3/2023 | Chang | G11C 11/2273 |
| 2006/0022236 A1* | 2/2006 | Shin | H10D 1/694 |
| | | | 257/295 |
| 2006/0022240 A1* | 2/2006 | Huang | H10B 12/03 |
| | | | 257/E21.654 |
| 2007/0006798 A1* | 1/2007 | Vaartstra | H01L 21/31691 |
| | | | 117/86 |
| 2008/0032424 A1* | 2/2008 | Ahn | H01L 29/40111 |
| | | | 257/E21.208 |
| 2008/0048225 A1* | 2/2008 | Ahn | H01L 21/02197 |
| | | | 257/295 |
| 2009/0294924 A1* | 12/2009 | Forbes | H01L 29/6653 |
| | | | 438/587 |
| 2011/0227142 A1* | 9/2011 | Ramaswamy | H01L 21/02148 |
| | | | 977/773 |
| 2011/0299318 A1* | 12/2011 | Kaneko | H01L 29/6684 |
| | | | 257/295 |
| 2013/0122609 A1* | 5/2013 | Ahn | H01L 21/02197 |
| | | | 438/3 |
| 2018/0190338 A1* | 7/2018 | Li | H01L 21/02532 |

(Continued)

*Primary Examiner* — Sheikh Maruf
(74) *Attorney, Agent, or Firm* — JCIPRNET (57) ABSTRACT

A method of fabricating a transistor structure is provided. The method comprises forming a gate electrode in a dielectric layer of an interconnect structure; forming a monolayer on a portion of the dielectric layer laterally spaced from the gate electrode; sequentially forming a ferroelectric layer, a barrier layer and a channel layer on the gate electrode; and forming a source/drain electrode on the channel layer.

20 Claims, 6 Drawing Sheets

(56) References Cited

U.S. PATENT DOCUMENTS

| | | | |
|---|---|---|---|
| 2019/0057860 A1* | 2/2019 | Yoon | H01L 21/28568 |
| 2019/0067488 A1* | 2/2019 | Tsai | H01L 29/66545 |
| 2019/0131425 A1* | 5/2019 | Lu | H01L 29/66545 |
| 2020/0020762 A1* | 1/2020 | Frank | H01L 21/0228 |
| 2020/0105770 A1* | 4/2020 | Yoo | G11C 11/221 |
| 2021/0296464 A1* | 9/2021 | Lai | H01L 21/0228 |
| 2021/0408013 A1* | 12/2021 | Young | H10B 63/84 |
| 2022/0149182 A1* | 5/2022 | Lai | H01L 29/516 |

\* cited by examiner

METHOD OF FABRICATING TRANSISTOR STRUCTURE

BACKGROUND

The semiconductor industry has grown due to continuous improvements in integration density of various electronic components (e.g., transistors, diodes, resistors, inductors, capacitors, etc.). For the most part, these improvements in integration density have come from successive reductions in minimum feature size, which allow more components to be integrated into a given area. In this regard, individual transistors, interconnects, and related structures have become increasingly smaller and there is an ongoing need to develop new materials, processes, and designs of semiconductor devices and interconnects to allow further progress.

Thin-film transistors made of oxide semiconductors are an attractive option for back-end-of-line (BEOL) integration and may not damage previously fabricated front-end-of-line (FEOL) and middle end-of-line (MEOL) devices. Circuits based on thin-film transistor devices may further include other components that may be fabricated in a BEOL process, such as capacitors, inductors, resistors, and integrated passive devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of fabricating a transistor structure is provided. In accordance with some embodiments of the present disclosure, a stack of a ferroelectric layer, a barrier layer and a channel layer are selective ALD deposited on a gate electrode of a metal/oxide (gate electrode/dielectric layer) heterogeneous surface, attributed to forming a monolayer on a dielectric layer laterally spaced from the gate electrode. The monolayer selective covered the dielectric layer can be attributed to a monolayer precursor using a functional group only to react with a hydroxyl group of an exposed portion of the dielectric layer. The monolayer as like a protection layer prevents the deposition of each layer of the stack via ALD process on a surface with the monolayer protection that results in the selective deposition of each layer of the stack over regions without the monolayer protection. Besides, an $O_2$ and/or $O_3$ plasma treatment is performed to remove the monolayer, and meanwhile fill-up an oxygen vacancy of a revealed surface of the dielectric layer after removing the monolayer. By improving the selective deposition of each the layer of the stack and resolving the situation of oxygen vacancy, the performance of the resulting transistors is improved. Embodiments discussed herein are to provide examples to enable making or using the subject matter of this disclosure, and a person having ordinary skill in the art will readily understand modifications that can be made while remaining within contemplated scopes of different embodiments.

Figure 1:
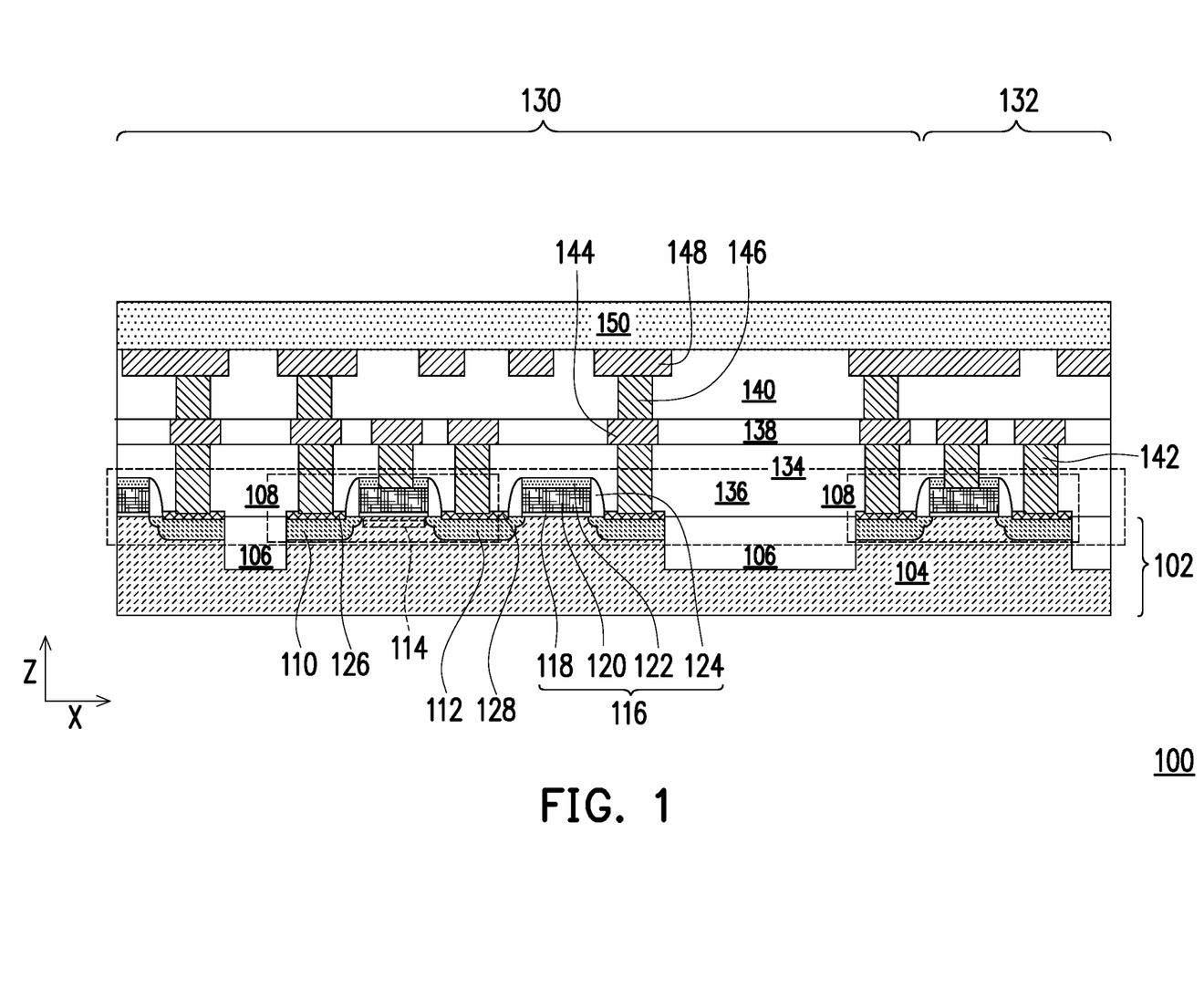
FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer in accordance with some embodiments.

Referring to FIG. 1, FIG. 1 illustrates a semiconductor structure 100, according to various embodiments. The semiconductor structure 100 includes a substrate 102, which may be a semiconductor substrate such as a commercially available silicon substrate. The substrate 102 may include a semiconductor material layer 104 or at least at an upper portion thereof. The semiconductor material layer 104 may be a surface portion of a bulk semiconductor substrate, or may be a top semiconductor layer of a semiconductor-on-insulator (SOI) substrate. In one embodiment, the semiconductor material layer 104 includes a single crystalline semiconductor material such as single crystalline silicon. In one embodiment, the substrate 102 may include a single crystalline silicon substrate including a single crystalline silicon material.

Shallow trench isolation structures 106 including a dielectric material such as silicon oxide may be formed in an upper portion of the semiconductor material layer 104. Suitably doped semiconductor wells, such as p-type wells and n-type wells, may be formed within each area that is laterally enclosed by a portion of the shallow trench isolation structures 106. Field effect transistors 108 may be formed over a top surface of the semiconductor material layer 104. For example, each of the field effect transistors 108 may include a source electrode 110, a drain electrode 112, a semiconductor channel 114 that includes a surface portion of the substrate 102 extending between the source electrode 110 and the drain electrode 112, and a gate structure 116. The semiconductor channel 114 may include a single crystalline semiconductor material.

Each gate structure 116 may include a gate dielectric layer 118, a gate electrode 120, a gate cap dielectric 122, and a dielectric gate spacer 124. A source-side metal-semiconductor alloy region 126 may be formed on each source electrode 110, and a drain-side metal-semiconductor alloy region 128 may be formed on each drain electrode 112. The devices formed on the top surface of the semiconductor material layer 104 may include complementary metal-oxide-semiconductor (CMOS) transistors and optionally additional semiconductor devices (such as resistors, diodes, capacitors, etc.), and are collectively referred to as CMOS circuitry 134.

The semiconductor structure 100 of FIG. 1 may include a memory array region 130 in which an array of memory cells may be subsequently formed. The first exemplary structure may further include a peripheral region 132 in which metal wiring for the array of memory devices is provided. Generally, the field effect transistors 108 in the CMOS circuitry 134 may be electrically connected to an electrode of a respective memory cell by a respective set of metal interconnect structures.

Devices (such as field effect transistors 108) in the peripheral region 132 may provide functions that operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a programming circuitry.

One or more of the field effect transistors 108 in the CMOS circuitry 134 may include a semiconductor channel 114 that contains a portion of the semiconductor material layer 104 in the substrate 102. If the semiconductor material layer 104 includes a single crystalline semiconductor material such as single crystalline silicon, the semiconductor channel 114 of each of the field effect transistors 108 in the CMOS circuitry 134 may include a single crystalline semiconductor channel such as a single crystalline silicon channel. In one embodiment, a plurality of field effect transistors 108 in the CMOS circuitry 134 may include a respective node that is subsequently electrically connected to a node of a respective memory cell to be subsequently formed. For example, a plurality of field effect transistors 108 in the CMOS circuitry 134 may include a respective source electrode 110 or a respective drain electrode 112 that is subsequently electrically connected to a node of a respective memory cell to be subsequently formed.

In one embodiment, the CMOS circuitry 134 may include a programming control circuit configured to control gate voltages of a set of field effect transistors 108 that may be used for programming a respective memory cell (e.g., a ferroelectric memory cell) and to control gate voltages of transistors (e.g., thin-film transistors) to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 102 may include a single crystalline silicon substrate, and the field effect transistors 108 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an embodiment, the field effect transistors 108 may be subsequently electrically connected to drain electrodes and gate electrodes of access transistors including semiconducting metal oxide plates to be formed above the field effect transistors 108. In one embodiment, a subset of the field effect transistors 108 may be subsequently electrically connected to at least one of the drain electrodes and the gate electrodes. For example, the field effect transistors 108 may include first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 108 may include bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 102 and the semiconductor devices thereupon (such as field effect transistors 108). In an illustrative example, the dielectric material layers may include, for example, a first dielectric material layer 136 that may be a layer that surrounds the contact structure connected to the source and drains (sometimes referred to as a contact-level dielectric material layer), a first interconnect-level dielectric material layer 138, and a second interconnect-level dielectric material layer 140. The metal interconnect structures may include device contact via structures 142 formed in the first dielectric material layer 136 and contact a respective component of the CMOS circuitry 134, first metal line structures 144 formed in the first interconnect-level dielectric material layer 138, first metal via structures 146 formed in a lower portion of the second interconnect-level dielectric material layer 140, and second metal line structures 148 formed in an upper portion of the second interconnect-level dielectric material layer 140.

Each of the dielectric material layers 136, 138, 140 may include a dielectric material such as undoped silicate glass, a doped silicate glass, organosilicate glass, amorphous fluorinated carbon, porous variants thereof, or combinations thereof. Each of the metal interconnect structures 142, 144, 146, 148 may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, TiN, alloys thereof, and/or combinations thereof.

Other suitable metallic liner and metallic fill materials within the contemplated scope of disclosure may also be used. In one embodiment, the first metal via structures 146 and the second metal line structures 148 may be formed as integrated line and via structures by a dual damascene process. The dielectric material layers 136, 138, 140 are herein referred to as lower-lower-level dielectric material layers. The metal interconnect structures 142, 144, 146, 148 formed within in the lower-level dielectric material layers are herein referred to as lower-level metal interconnect structures.

While the disclosure is described using an embodiment in which an array of memory cells may be formed over the second line-and-via-level dielectric material layer 140, embodiments are expressly contemplated herein in which the array of memory cells may be formed at a different metal interconnect level.

An array of thin-film transistors and an array of ferroelectric memory cells (or other types of memory cells) may be subsequently deposited over the dielectric material layers 136, 138, 140 that have formed therein the metal interconnect structures 142, 144, 146, 148) The set of all dielectric material layer that are formed prior to formation of an array of thin-film transistors or an array of ferroelectric memory cells is collectively referred to as lower-level dielectric material layers 136, 138, 140. The set of all metal interconnect structures that is formed within the lower-level dielectric material layers 136, 138, 140 is herein referred to as first metal interconnect structures 142, 144, 146, 148. Generally, first metal interconnect structures 142, 144, 146, 148 formed within at least one lower-level dielectric material layer 136, 138, 140 may be formed over the semiconductor material layer 104 that is located in the substrate 102.

According to an embodiment, thin-film transistors may be subsequently formed in a metal interconnect level that overlies that metal interconnect levels that contain the lower-level dielectric material layers 136, 138, 140 and the first metal interconnect structures 142, 144, 146, 148. In one embodiment, a planar dielectric material layer having a uniform thickness may be formed over the lower-level dielectric material layers 136, 138, 140. The planar dielectric material layer is herein referred to as an insulating matrix layer 150. The insulating matrix layer 150 may include a dielectric material such as undoped silicate glass, a doped silicate glass, organosilicate glass, or a porous dielectric material, and may be deposited by chemical vapor deposition. The thickness of the insulating matrix layer 150 may be in a range from 20 nm (i.e., 200 angstrom) to 300 nm (i.e., 3000 angstrom), although lesser and greater thicknesses may also be used.

Generally, interconnect-level dielectric layers (such as the lower-level dielectric material layer 136, 138, 140) containing therein the metal interconnect structures (such as the first metal interconnect structures 142, 144, 146, 148) may be formed over semiconductor devices. The insulating matrix layer 150 may be formed over the interconnect-level dielectric layers. Other passive devices may be formed in BEOL processes. For example, various capacitors, inductors, resistors, and integrated passive devices may be utilized with other BEOL devices.

FIG. 2A to FIG. 2J illustrate the cross-sectional views of intermediate stages in the formation of a transistor structure in accordance with some embodiments.

Figure 2A:
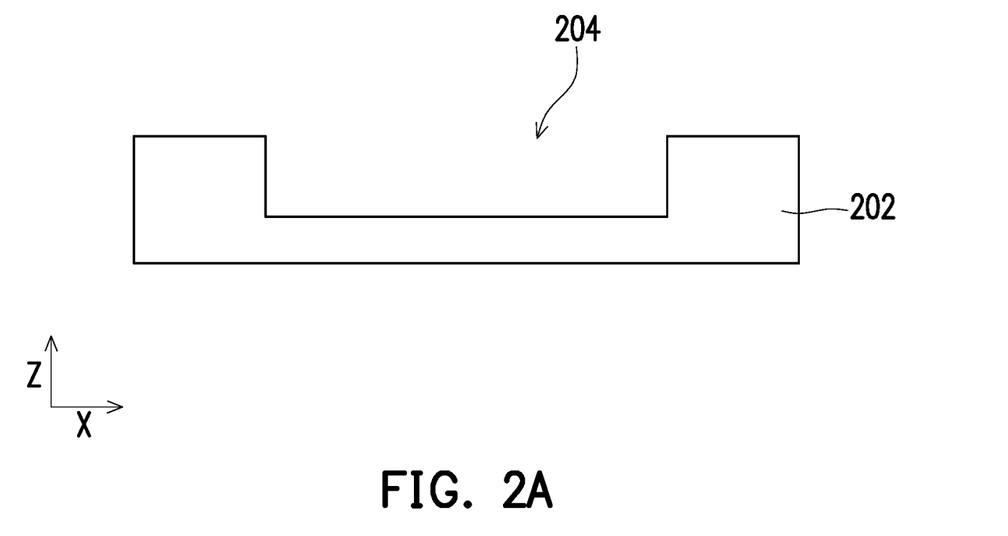
FIG. 2A to FIG. 2J illustrate the cross-sectional views of intermediate stages in the formation of a transistor structure in accordance with some embodiments.

Referring to FIG. 2A, a removal process or a patterning process (e.g., an anisotropic etch process) is performed on a first dielectric layer (i.e., an inter-layer dielectric layer of an interconnect structure) 202 to remove a portion of the first dielectric layer 202 thereby an opening 204 (e.g., a cavity) is formed in the first dielectric layer 202. In some embodiments, a photoresist (not shown) is formed over the first dielectric layer 202. The photoresist may then be patterned using photolithography techniques to generate an opening in the photoresist. The patterned photoresist may then be used as a mask for patterning the first dielectric layer 202. In this regard, an anisotropic etch process may be performed to remove a region of the first dielectric layer 202 to form the opening 204 in the region of the first dielectric layer 202. After performing the removal process (e.g., an anisotropic etch process), any residual photoresist is removed by an ash process or by dissolution with a solvent.

Figure 2B:
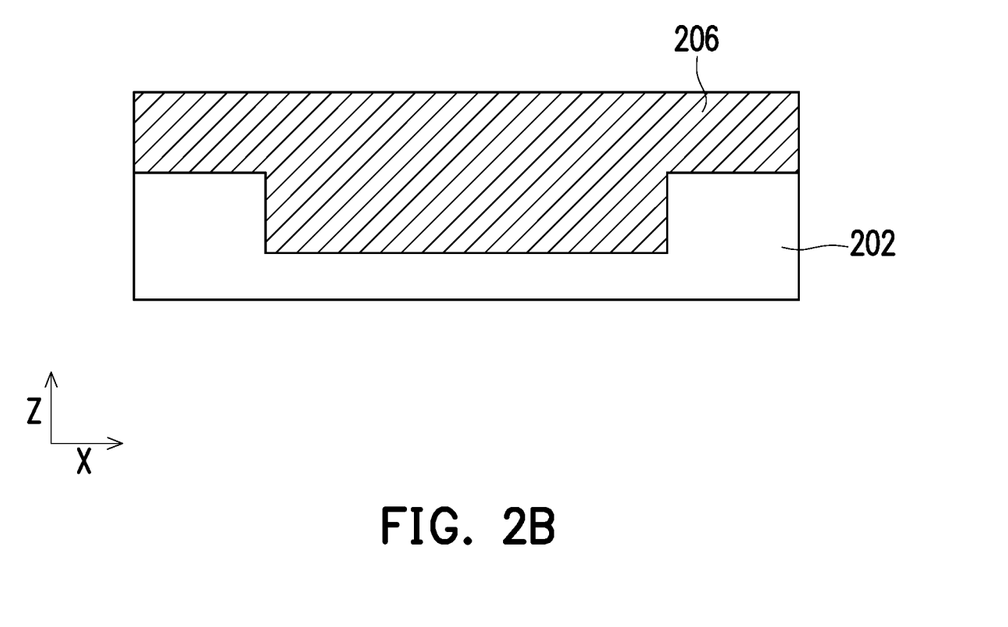

Referring to FIG. 2B, a conductive material layer 206 is deposited on the first dielectric layer 202 such that the opening 204 defined in the first dielectric layer 202 is filled with the conductive material layer 206. The conductive material layer 206 not only fills the opening 204 defined in the first dielectric layer 202, but also covers the top surface of the first dielectric layer 202. The conductive material layer 206 may include a metallic liner material and/or a metallic fill material. The metallic liner material may include a conductive metallic nitride or a conductive metallic carbide such as TiN, TiN/W, Ti/Al/Ti, TaN, WN, TiC, TaC, and/or WC. The metallic fill material may include W, Cu, Al, Co, Ru, Mo, Ta, Ti, TiN, TaN, WCN, alloys thereof, and/or combinations thereof. Other suitable metallic liner and metallic fill materials within the contemplated scope of this disclosure may also be used. The metallic liner material and metallic fill materials may be formed by suitable deposition process, which may include one or more of a CVD process, a PVD process, an ALD process, an electroplating process, etc. Other suitable deposition processes are within the contemplated scope of disclosure.

Figure 2C:
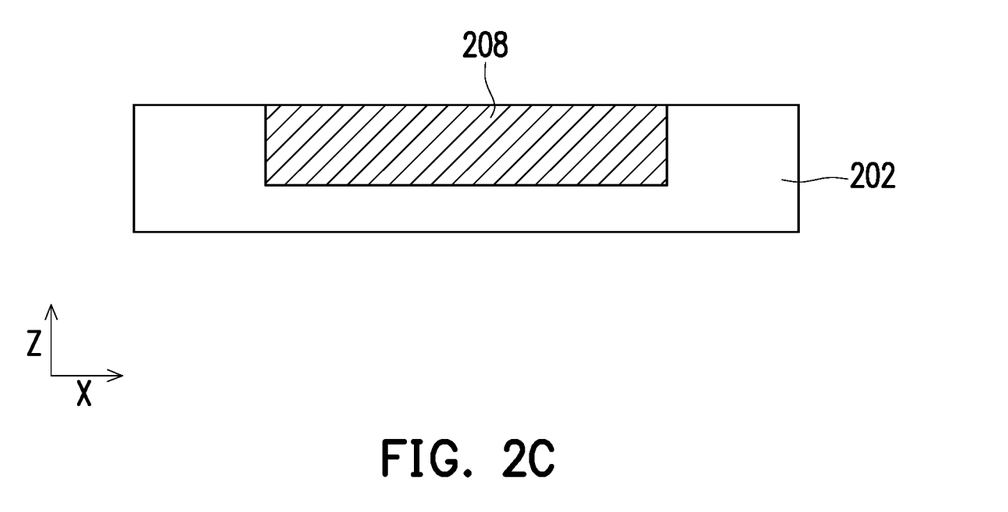

Referring to FIG. 2C, a removal process (e.g., a planarization process) is performed to remove excess portions of the conductive material layer 206 until the top surface of the patterned first dielectric layer 202 is revealed such that a gate electrode 208 is formed in the opening 204. The gate electrode 208 is embedded in the defined in the first dielectric layer 202, and the top surface of the gate electrode 208 substantially levels with the top surface of the patterned first dielectric layer 202. The above-mentioned removal process may include a CMP process although other suitable removal processes may be used. A thickness of the gate electrode 208 may be in a range from approximately 5 nm to approximately 50 nm, such as from approximately 20 nm to approximately 40 nm, although other embodiments may include smaller and larger thicknesses.

Figure 2D:
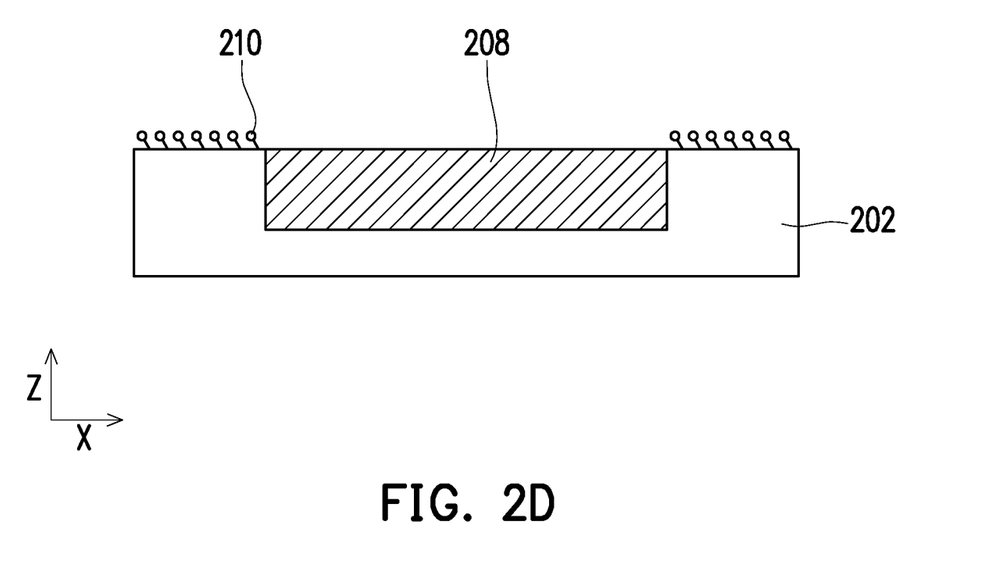

Referring to FIG. 2D, a monolayer 210 is formed on a portion of the first dielectric layer 202 such as a surface (e.g., a top surface) uncovered by the gate electrode 208. In some embodiments, a monolayer precursor is applied over the first dielectric layer 202 such that the monolayer precursor reacts with an exposed portion of the first dielectric layer 202 (for example, the first dielectric layer 202 uncovered by the gate electrode 208) to form the monolayer 210. Then, an unreacted monolayer precursor among the monolayer precursor is removed. In some embodiments, the monolayer 210 is formed on the portion of the first dielectric layer 202 which is not in contact with the gate electrode 208. In some embodiments, a thickness of the monolayer 210 may be in a range from approximately 0.4 nm to approximately 5 nm.

In some embodiments, a terminal end of the monolayer precursor comprises a functional group to react with a hydroxyl group of the exposed portion of the first dielectric layer 202 to form the monolayer 210 on the top surface of the patterned first dielectric layer 202. The monolayer 210 is linked with the first dielectric layer 202 by covalent bonds. In some embodiments, a first terminal end of the monolayer precursor comprises a functional group selected from —SiCl$_3$, —COOH, —SiH$_3$, —Si(OCH$_2$CH$_3$)$_3$, —CH=CH$_2$ or —C≡CH, and a second terminal end of the monolayer precursor comprises a functional group selected from —CH$_3$, —CF$_3$, —CH=CH$_2$ or —C≡CH.

In some embodiments, the monolayer precursor is presented by Chemical Formula 1.

[Chemical Formula 1]

in Chemical Formula 1,
R$^1$ is selected from —CH$_3$, —CF$_3$, —CH═CH$_2$ or —C≡CH,
R$^2$ is selected from —SiCl$_3$, —COOH, —SiH$_3$, —Si(OCH$_2$CH$_3$)$_3$, —CH═CH$_2$ or —C≡CH, and
n is an integer of 3 to 12.

In some other embodiments, the monolayer precursor is presented by Chemical Formula 2:

[Chemical Formula 2]

in Chemical Formula 2,
R$^1$ is selected from —CH$_3$, —CF$_3$, —CH═CH$_2$ or —C≡CH,
R$^2$ is selected from —SiCl$_3$, —COOH, —SiH$_3$, —Si(OCH$_2$CH$_3$)$_3$, —CH═CH$_2$ or —C≡CH, and
m is an integer of 2 to 4.

In some alternative embodiments, the monolayer precursor is presented by Chemical Formula 3:

[Chemical Formula 3]

in Chemical Formula 3,
R$^1$ is selected from —CH$_3$, —CF$_3$, —CH═CH$_2$ or —C≡CH,
R$^2$ is selected from —SiCl$_3$, —COOH, —SiH$_3$, —Si(OCH$_2$CH$_3$)$_3$, —CH═CH$_2$ or —C≡CH,
each X is independently selected from —CH$_2$— or —CF$_2$—, and
y is an integer of 3 to 12.

Figure 2E:
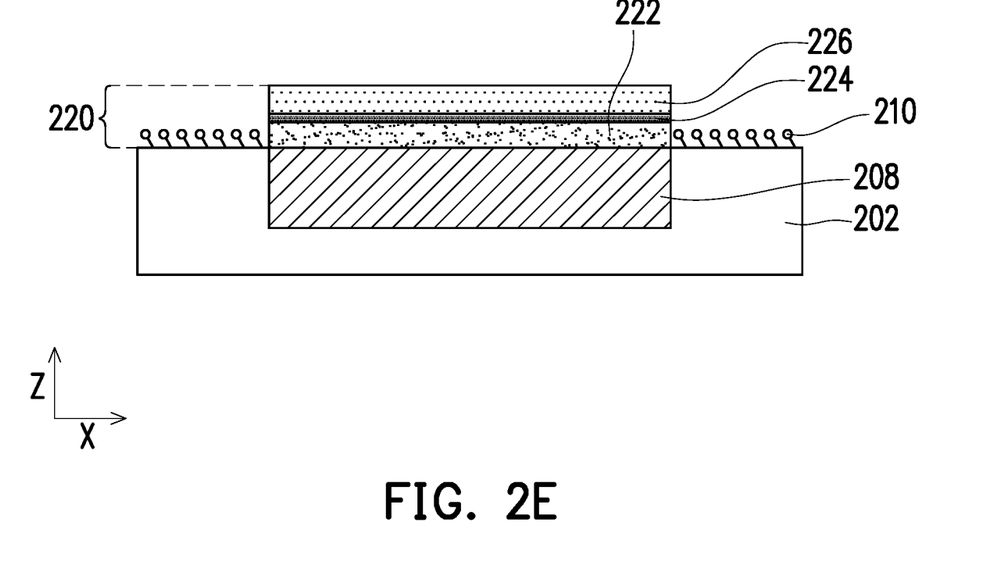

Referring to FIG. 2E, a ferroelectric layer 222, a barrier layer 224 and a channel layer 226 are sequentially formed on the gate electrode 208 such that a stack structure 220 is selectively formed on the gate electrode 208. In some embodiments, the ferroelectric layer is 222 deposited on the gate electrode 208 by performing an atomic layer deposition process. In some embodiments, the barrier layer 224 is deposited on the ferroelectric layer 222 by performing an atomic layer deposition process. In some embodiments, the channel layer 226 is deposited on the barrier layer 224 by performing an atomic layer deposition process.

In some embodiments, the monolayer 210 is laterally spaced from a sidewall of the ferroelectric layer 222 after depositing the ferroelectric layer 222. The ferroelectric layer 222 is not deposited on a top surface of the monolayer 210. In some embodiments, the monolayer 210 is laterally spaced from a sidewall of a stack of the ferroelectric layer 222 and the barrier layer 224 after depositing the barrier layer 224. The barrier layer 224 is not deposited on the top surface of the monolayer 210. In some embodiments, the monolayer 210 is laterally spaced from a sidewall of the stack structure 220 including the ferroelectric layer 222, the barrier layer 224 and the channel layer 226 after depositing the channel layer 226. The channel layer 226 is not deposited on the top surface of the monolayer 210. In some embodiments, the stack structure 220 may include vertical sidewalls. In other words, the sidewalls of the stack structure 220 may be substantially vertical to the top surface of the gate electrode 208. In some embodiments, the top surface of the gate electrode 208 may locate at X-Y plane (Y is not shown). In some embodiments, as illustrated in FIG. 2E, an included angle between the sidewall of the stack structure 220 and the top surface of the gate electrode 208 is about 90 degrees. In some other embodiments, an included angle between the sidewall of the stack structure 220 and the top surface of the gate electrode 208 is greater than about 90 degrees.

In some embodiments, a thickness of the ferroelectric layer 222 may be in a range from approximately 3 nm to approximately 15 nm, such as from approximately 5 nm to approximately 12 nm, although other embodiments may include smaller and larger thicknesses. In some embodiments, the ferroelectric layer 222 may include a high-k dielectric material including, but is not limited to, one or more of hafnium oxide (HfO$_2$), hafnium lanthanum oxide, hafnium silicon oxide (HfSiO), hafnium tantalum oxide, hafnium titanium oxide, hafnium zirconium oxide (HfZrO), zirconium oxide, titanium oxide, aluminum oxide, and hafnium dioxide-alumina, HfCeZrO, or various other insulating structures such as a multi-layer stack structure including alternating insulating layers. In some embodiments, a thickness of the barrier layer 224 may be in a range from approximately 2 nm to approximately 10 nm. In some embodiments, the barrier layer 224 may include, but is not limited to, WCN, WN, WC, Al$_2$O$_3$, ZrO$_2$ or the like.

In some embodiments, a thickness of the channel layer 226 may be in a range from approximately 3 nm to approximately 20 nm, such as from approximately 5 nm to approximately 15 nm, although other embodiments may include smaller and larger thicknesses. In some embodiments, the channel layer 226 may include, but is not limited to, amorphous silicon, InGaZnO, InGaO, InWO, InZnO, InSnO, ZnO, ZnSnO (zinc tin oxide), GaO, InO, and alloys thereof. Other suitable semiconducting materials are within the contemplated scope of disclosure. In some embodiments, the channel layer 226 may include a composition given by In$_x$Ga$_y$Zn$_z$MO, wherein 0<x<1; 0≤y≤1; 0≤z≤1; and M is one of Ti, Al, Ag, Ce, and Sn.

Figure 2F:
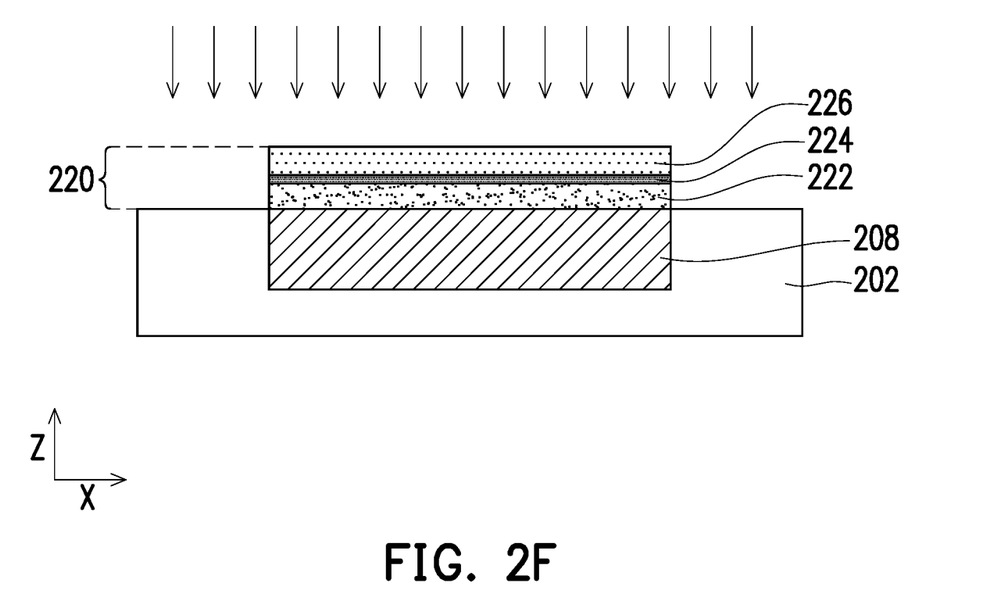

Referring to FIG. 2F, the monolayer 210 is removed by an ash process after forming the channel layer 226. In some embodiments, the ash process is performed through an O$_2$ and/or O$_3$ plasma treatment. As a result, the O$_2$ and/or O$_3$ plasma treatment is performed to remove the monolayer 210, then fill-up an oxygen vacancy of a revealed surface of the first dielectric layer 202 after removing the monolayer 210.

Figure 2G:
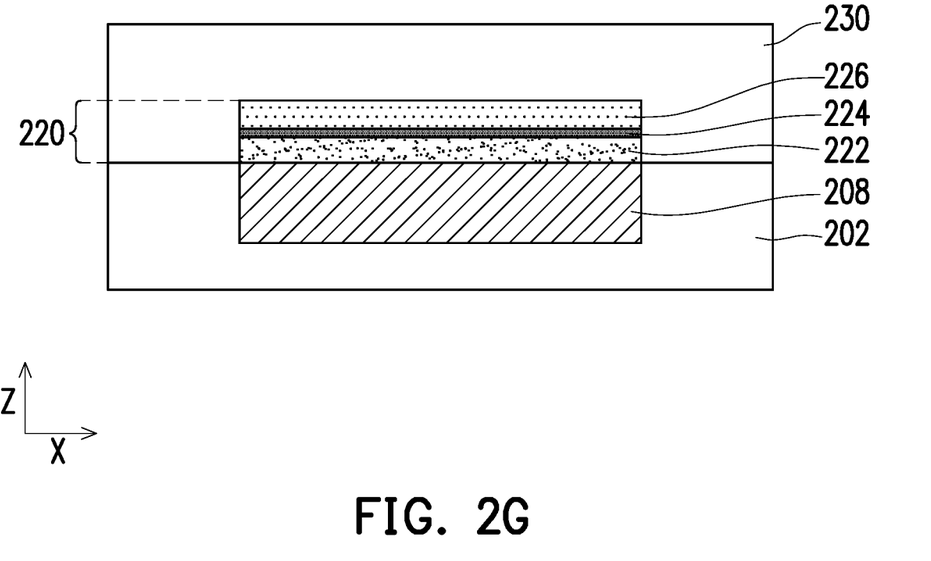

Referring to FIG. 2G, a second dielectric layer (an interlayer dielectric layer of an interconnect structure) 230 for capping the stack structure 220 is formed over the stack structure 220 and the top surface of the first dielectric layer 202. The second dielectric layer 230 may be or include the same material as the first dielectric layer 202 or may include a different material. In this regard, the second dielectric layer 230 may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. The second dielectric layer 230 may be deposited by any suitable technique as CVD, ALD, PVD, PECVD, etc.

In this example, the second dielectric layer 230 may be an un-patterned dielectric layer having a planar top surface. A thickness of second dielectric layer 230 may be in a range from approximately 5 nm to approximately 50 nm, such as from approximately 20 nm to approximately 40 nm, although other embodiments may include smaller and larger thicknesses.

Figure 2H:
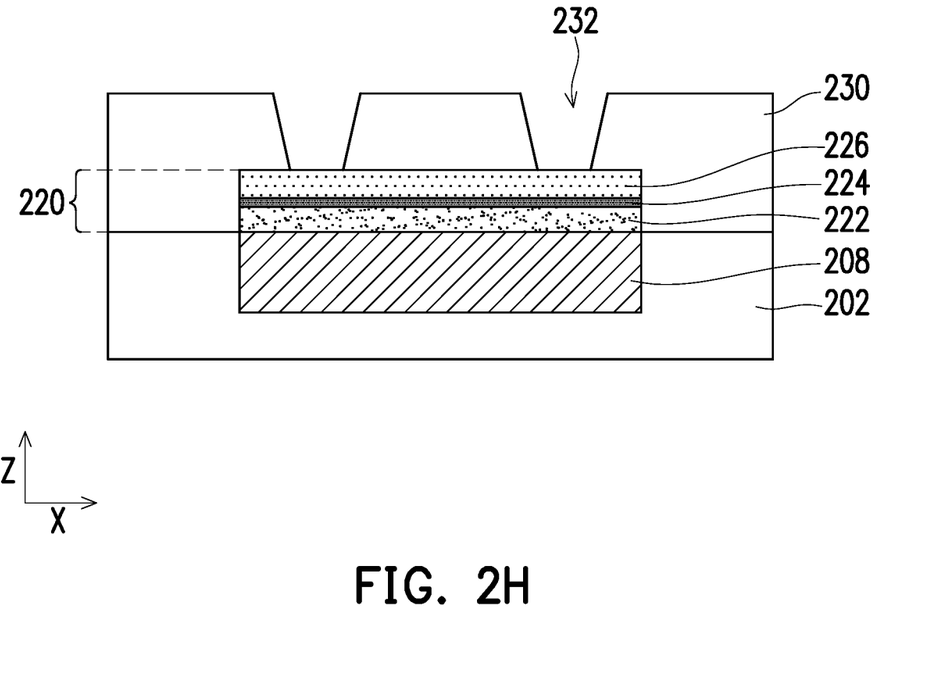

Referring to FIG. 2H, a removal process or patterning process (e.g., a photolithography process followed by an anisotropic etch process) is performed on the second dielectric layer 230 to remove a portion of the second dielectric layer 230 thereby openings 232 are formed in the second dielectric layer 230. In some embodiments, a photoresist (not shown) may be formed over the second dielectric layer 230. The photoresist may then be patterned using photolithography techniques to form openings in the photoresist. The patterned photoresist may then be used as a mask for patterning the second dielectric layer 230. In this regard, an anisotropic etch process may be performed to remove portions of the second dielectric layer 230 until portions of the channel layer 226 are revealed by the openings 232 defined in the second dielectric layer 230. After performing the patterning process of the second dielectric layer 230, any residual photoresist may be removed by an ash process or by dissolution with a solvent.

Figure 2I:
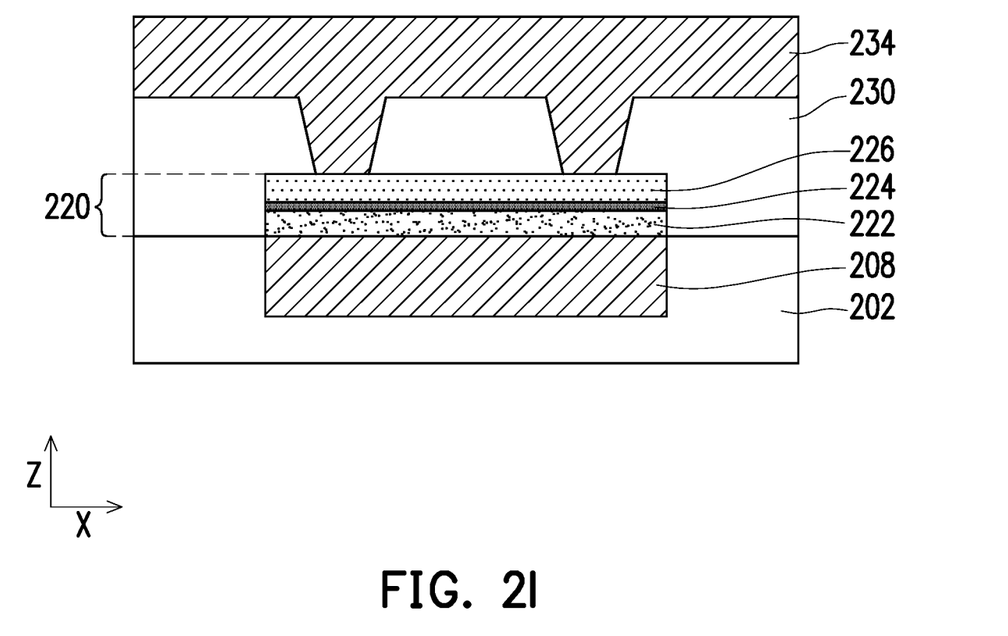

Referring to FIG. 2I, a conductive material layer 234 is deposited on the second dielectric layer 230 and fills the openings 232 defined in the second dielectric layer 230. The deposited conductive material layer 234 may include a metallic liner material and a metallic fill material. The metallic liner material may include a conductive metallic nitride or a conductive metallic carbide such as TiN, TiN/W, Ti/Al/Ti, TaN, WN, TiC, TaC, and/or WC. A thickness of the metallic liner material may be in a range from approximately 1 nm to approximately 10 nm, such as from approximately 3 nm to approximately 8 nm, although smaller and larger thicknesses may also be used.

The metallic fill material may include W, Cu, Al, Co, Ru, Mo, Ta, Ti, TiN, TaN, WCN, alloys thereof, and/or combinations thereof. Other suitable metallic liner and metallic fill materials within the contemplated scope of this disclosure may also be used. A thickness of the metallic fill material may be in a range from approximately 10 nm to approximately 50 nm, such as from approximately 20 nm to approximately 40 nm, although smaller and larger thicknesses may also be used.

The metallic liner material and metallic fill materials may be formed by suitable deposition process, which may be or include one or more of a CVD process, a PVD process, an ALD process, an electroplating process, etc. Other suitable deposition processes are within the contemplated scope of disclosure.

Figure 2J:
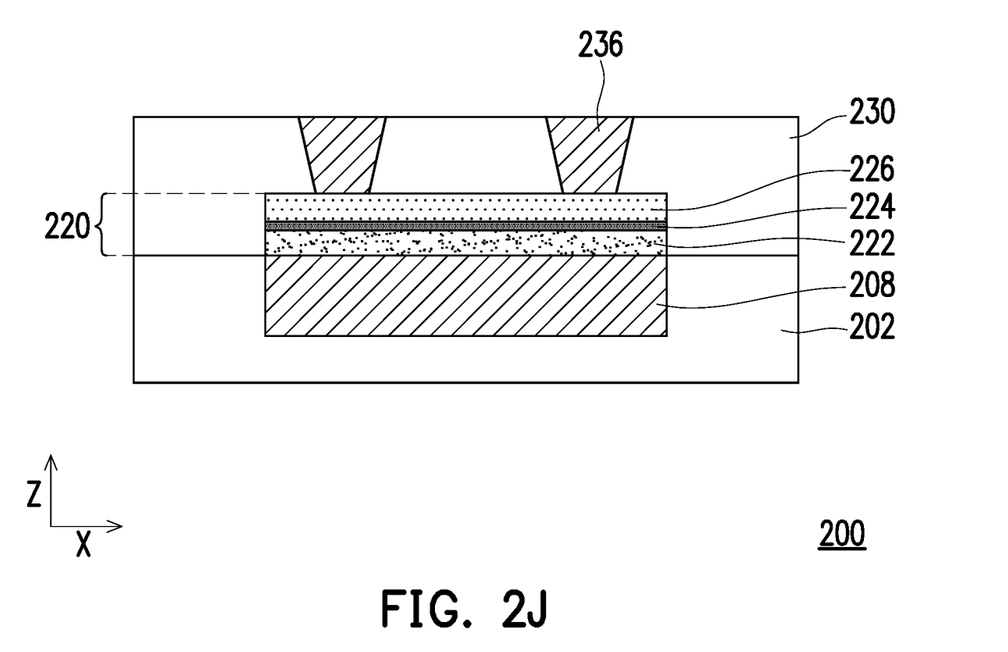

Referring to FIG. 2J, excess portions of the conductive material layer 234 may be removed to form source/drain electrodes 236 on the channel layer 226. In some embodiments, excess portions of the conductive material layer 234 are removed until the top surface of the patterned second dielectric layer 230 is revealed by a planarization process such as CMP, although other suitable planarization processes may be used.

In some embodiments, a transistor structure 200 is formed after removing excess portions of the conductive material layer 234. The transistor structure 200 may be a ferroelectric field-effect transistor (FeFET) structure. The transistor structure 200 includes the gate electrode 208, the ferroelectric layer 222, the barrier layer 224, the channel layer 226, and the source/drain electrodes 236.

A method of fabricating a transistor structure is provided. The embodiments of the present disclosure have some advantageous features. A heterogeneous surface includes a surface such as metal/oxide, metallic/oxide, semi-conductive compound/oxide or the like. In accordance with some embodiments of the present disclosure, a stack of a ferroelectric layer, a barrier layer and a channel layer are selective deposited on a gate electrode of a metal/oxide (gate electrode/dielectric layer) heterogeneous surface. The formation of the stack on the gate electrode of the heterogeneous surface is by forming a monolayer on a portion of a dielectric layer laterally spaced from the gate electrode and performing an atomic layer deposition (ALD) process to sequentially deposit the ferroelectric layer, the barrier layer and the channel layer on the gate electrode. The monolayer selective covered dielectric layer can be attributed to the monolayer precursor using a functional group only to react with a of hydroxyl group of an exposed portion of the dielectric layer. The monolayer as like a protection layer prevents the deposition of each layer of the stack via ALD process on the surface with the monolayer protection that results in the selective deposition of each layer of the stack over the regions without the monolayer protection. Besides, an $O_2$ and/or $O_3$ plasma treatment is performed to remove the monolayer, and meanwhile fill-up an oxygen vacancy of a revealed surface of the dielectric layer after removing the monolayer. By improving selective deposition of each layer of the stack and resolving the situation of oxygen vacancy, the performance of the resulting transistors is improved.

In accordance with some embodiments of the present disclosure, a method comprises forming a gate electrode in a dielectric layer of an interconnect structure; forming a monolayer on a portion of the dielectric layer laterally spaced from the gate electrode; sequentially forming a ferroelectric layer, a barrier layer and a channel layer on the gate electrode; and forming a source/drain electrode on the channel layer.

In accordance with some embodiments of the present disclosure, a method comprises forming a dielectric layer of an interconnect structure on a substrate; forming a gate electrode in the dielectric layer; forming a monolayer on a portion of the dielectric layer uncovered by the gate electrode; forming a ferroelectric layer on the gate electrode; forming a barrier layer on the ferroelectric layer; forming a channel layer on the barrier layer; and forming a source/drain electrode on the channel layer.

In accordance with some embodiments of the present disclosure, a method comprises forming first transistors in a substrate; forming an interconnect structure on the substrate, the interconnect structure comprising second transistors. A process for fabricating the second transistors comprises forming a gate electrode in a dielectric layer of the interconnect structure; forming a monolayer on a portion of the dielectric layer uncovered by the gate electrode; forming a ferroelectric layer on the gate electrode; forming a barrier layer on the ferroelectric layer; forming a channel layer on the barrier layer; and forming a source/drain electrode on the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a gate electrode in a dielectric layer of an interconnect structure;
        forming a monolayer on a portion of the dielectric layer laterally spaced from the gate electrode, forming the monolayer on the portion of the dielectric layer laterally spaced from the gate electrode further comprises:
            applying a monolayer precursor over the dielectric layer such that the monolayer precursor reacts with an exposed portion of the dielectric layer to form the monolayer; and
            removing an unreacted monolayer precursor among the monolayer precursor;
        sequentially forming a ferroelectric layer, a barrier layer and a channel layer on the gate electrode; and
        forming a source/drain electrode on the channel layer.

2. The method of claim 1, wherein sequentially forming the ferroelectric layer, the barrier layer and the channel layer on the gate electrode further comprises:
    performing an atomic layer deposition process to sequentially deposit the ferroelectric layer, the barrier layer and the channel layer on the gate electrode to form a stack structure, wherein the monolayer is laterally spaced from a sidewall of the stack structure.

3. The method of claim 1, wherein the ferroelectric layer is formed by depositing at least one material layer on a surface of the gate electrode, and the at least one material layer comprises HfZrO, HfO$_2$, HfSiO, or HfCeZrO.

4. The method of claim 1, wherein the ferroelectric layer is formed to be in contact with the gate electrode.

5. The method of claim 1, wherein a terminal end of the monolayer precursor comprises a functional group selected from —SiCl$_3$, —COOH, —SiH$_3$, —Si(OCH$_2$CH$_3$)$_3$, —CH=CH$_2$ or —C≡CH.

6. The method of claim 1, wherein the monolayer is removed by an ash process after forming the channel layer.

7. A method, comprising:
    forming a dielectric layer of an interconnect structure on a substrate;
    forming a gate electrode in the dielectric layer;
    forming a monolayer on a portion of the dielectric layer uncovered by the gate electrode;
    forming a ferroelectric layer on the gate electrode, wherein the ferroelectric layer is laterally spaced apart from a sidewall of the monolayer;
    forming a barrier layer on the ferroelectric layer;
    forming a channel layer on the barrier layer; and
    forming a source/drain electrode on the channel layer.

8. The method of claim 7, wherein forming the ferroelectric layer on the gate electrode, forming the barrier layer on the ferroelectric layer and forming the channel layer on the barrier layer further comprises:
    performing an atomic layer deposition process to deposit the ferroelectric layer on the gate electrode;
    performing an atomic layer deposition process to deposit the barrier layer on the ferroelectric layer; and
    performing an atomic layer deposition process to deposit the channel layer on the barrier layer,
    wherein the monolayer is laterally spaced from a sidewall of a stack structure of the ferroelectric layer, the barrier layer and the channel layer.

9. The method of claim 7, wherein the ferroelectric layer is formed by depositing at least one material layer on a surface of the gate electrode, and the at least one material layer comprises HfZrO, HfO$_2$, HfSiO, or HfCeZrO.

10. The method of claim 7, wherein forming the monolayer on the portion of the dielectric layer uncovered by the gate electrode further comprises:
    applying a monolayer precursor over the dielectric layer such that the monolayer precursor reacts with an exposed portion of the dielectric layer to form the monolayer; and
    removing an unreacted monolayer precursor among the monolayer precursor.

11. The method of claim 10, wherein a first terminal end of the monolayer precursor comprises a functional group selected from —SiCl$_3$, —COOH, —SiH$_3$, —Si(OCH$_2$CH$_3$)$_3$, —CH=CH$_2$ or —C≡CH.

12. The method of claim 11, wherein a second terminal end of the monolayer precursor comprises a functional group selected from —CH$_3$, —CF$_3$, —CH=CH$_2$ or —C≡CH.

13. The method of claim 7, wherein the monolayer is removed by an ash process after forming the channel layer.

14. A method, comprising:
    forming first transistors in a substrate;
    forming an interconnect structure on the substrate, the interconnect structure comprising second transistors, wherein a process for fabricating the second transistors comprises:
        forming a gate electrode in a dielectric layer of the interconnect structure;
        forming a monolayer on a portion of the dielectric layer uncovered by the gate electrode;
        forming a ferroelectric layer on the gate electrode;
        forming a barrier layer on the ferroelectric layer;
        forming a channel layer on the barrier layer, wherein the monolayer is laterally spaced from the channel layer; and
        forming a source/drain electrode on the channel layer.

15. The method of claim 14, wherein forming the ferroelectric layer on the gate electrode, forming the barrier layer on the ferroelectric layer and forming the channel layer on the barrier layer further comprises:
    performing an atomic layer deposition process to deposit the ferroelectric layer on the gate electrode;
    performing an atomic layer deposition process to deposit the barrier layer on the ferroelectric layer; and
    performing an atomic layer deposition process to deposit the channel layer on the barrier layer,
    wherein the monolayer is laterally spaced from a sidewall of a stack structure of the ferroelectric layer, the barrier layer and the channel layer.

16. The method of claim 14, wherein the ferroelectric layer is formed by depositing at least one material layer on a surface of the gate electrode, and the at least one material layer comprises HfZrO, HfO$_2$, HfSiO, or HfCeZrO.

17. The method of claim 14, wherein forming the monolayer on the portion of the dielectric layer uncovered by the gate electrode further comprises:
    applying a monolayer precursor over the dielectric layer such that the monolayer precursor reacts with an exposed portion of the dielectric layer to form the monolayer; and
    removing an unreacted monolayer precursor among the monolayer precursor.

18. The method of claim 17, wherein a first terminal end of the monolayer precursor comprises a functional group selected from —SiCl$_3$, —COOH, —SiH$_3$, —Si(OCH$_2$CH$_3$)$_3$, —CH=CH$_2$ or —C≡CH.

19. The method of claim 18, wherein a second terminal end of the monolayer precursor comprises a functional group selected from —CH$_3$, —CF$_3$, —CH=CH$_2$ or —C≡CH.

20. The method of claim 14, wherein the monolayer is removed by an ash process after forming the channel layer.

* * * * *